United States Patent
Noh (10) Patent No.: US 8,509,019 B2
(45) Date of Patent: Aug. 13, 2013

(54) VOLTAGE GENERATION CIRCUIT AND NONVOLATILE MEMORY DEVICE INCLUDING THE SAME

(75) Inventor: Yu Jong Noh, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 12/702,480

(22) Filed: Feb. 9, 2010

(65) Prior Publication Data

US 2010/0284226 A1    Nov. 11, 2010

(30) Foreign Application Priority Data

May 11, 2009    (KR) .................. 10-2009-0040714

(51) Int. Cl.
*G11C 7/02*    (2006.01)

(52) U.S. Cl.
USPC ............. 365/210.11; 365/185.21; 365/185.2

(58) Field of Classification Search
USPC ................ 365/185.21, 207, 210.11, 185.2
See application file for complete search history.

(56) References Cited

U.S. PATENT DOCUMENTS

| | | | | |
|---|---|---|---|---|
| 6,055,190 A * | 4/2000 | Lu et al. | | 365/185.22 |
| 6,125,052 A * | 9/2000 | Tanaka | | 365/185.03 |
| 7,173,854 B2 * | 2/2007 | Cernea et al. | | 365/185.12 |
| 7,606,071 B2 * | 10/2009 | Sekar et al. | | 365/185.17 |
| 7,764,547 B2 * | 7/2010 | Lee et al. | | 365/185.17 |
| 7,782,679 B2 * | 8/2010 | Yun | | 365/185.21 |
| 2009/0003077 A1 * | 1/2009 | Lim | | 365/185.21 |

FOREIGN PATENT DOCUMENTS

KR    1020090020467    2/2009

OTHER PUBLICATIONS

Notice of Allowance issued from Korean Intellectual Property Office on Jun. 1, 2011.

* cited by examiner

*Primary Examiner* — Kretelia Graham
(74) *Attorney, Agent, or Firm* — IP & T Group LLP (57) ABSTRACT

A voltage generation circuit for providing a read or verification voltage of a nonvolatile memory device includes a first voltage generation unit configured to output a first voltage using a first reference voltage, a bouncing compensation unit configured to change the first voltage using a first control signal, the first voltage, and a voltage of a global source line when a read or verification operation is performed on the nonvolatile memory device, and to output a changed first voltage as a second voltage, a second reference voltage generation unit configured to generate a second reference voltage, and an amplification unit configured to amplify a difference between the second voltage and the second reference voltage according to a set resistance ratio and to output a result of the amplification as a third voltage.

18 Claims, 4 Drawing Sheets

VOLTAGE GENERATION CIRCUIT AND NONVOLATILE MEMORY DEVICE INCLUDING THE SAME

CROSS-REFERENCE TO RELATED APPLICATION

Priority to Korean patent application number 10-2009-0040714 filed on May 11, 2009, the entire disclosure of which is incorporated by reference herein, is claimed.

BACKGROUND

Exemplary embodiments relate to a voltage generation circuit and a nonvolatile memory device including the same, which are capable of compensating for the bouncing phenomenon of a global source line.

There is an increasing demand for semiconductor memory devices which can be electrically programmed and erased and can retain data without being supplied with power. In order to develop high-capacity memory devices capable of storing a large amount of data, technology for the high integration of memory cells is being developed.

To this end, a nonvolatile memory device may include a number of cell strings. Each of the cell strings includes a number of memory cells coupled in series together.

Recently, to further increase the degree of integration of nonvolatile memory devices, active research is being done on a multi-bit cell which is able to store plural bits of data in a single memory cell. This type of a memory cell is called a multi-level cell (MLC). A memory cell capable of storing one bit is called a single level cell (SLC).

Figure 1:
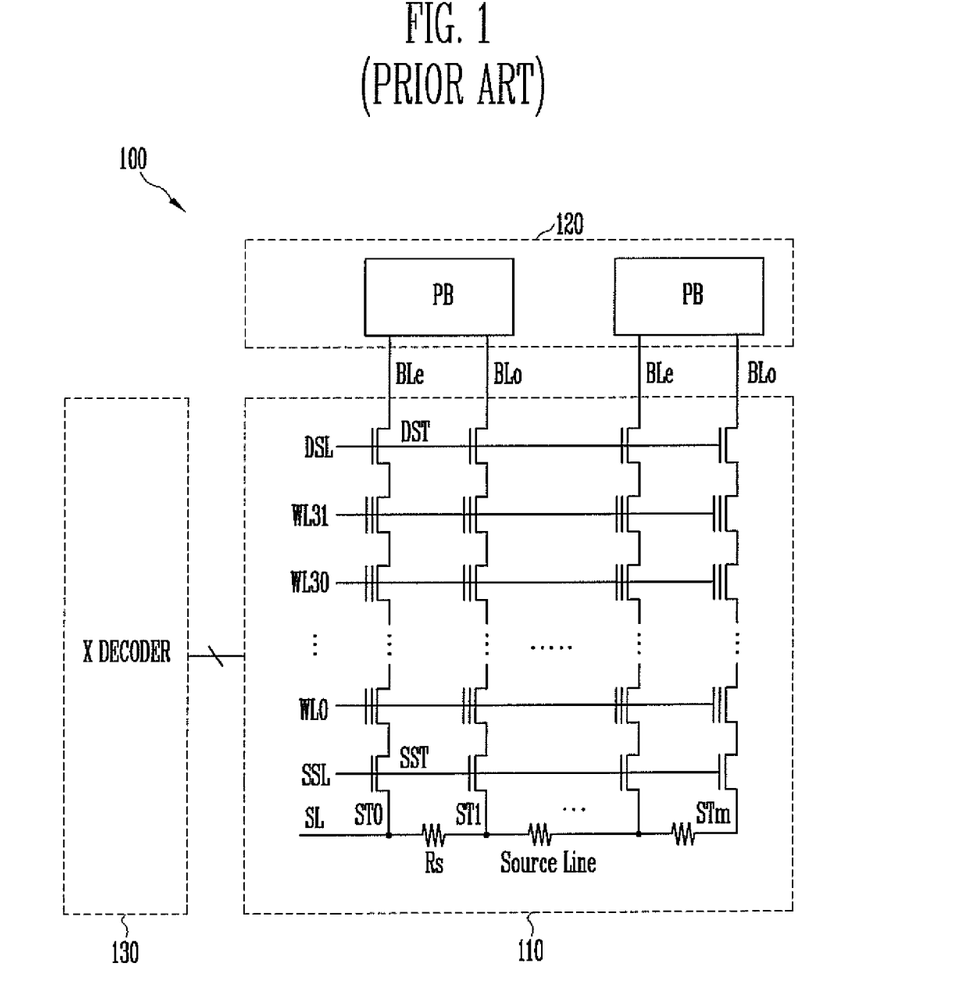
FIG. 1 is a diagram showing an example in which the memory cells of a conventional nonvolatile memory device are coupled together.

FIG. 1 is a diagram schematically showing an example in which the memory cells of a conventional nonvolatile memory device are coupled together.

Referring to FIG. 1, the nonvolatile memory device 100 includes a memory cell array 110, a page buffer unit 120, and an X decoder 130.

The memory cell array 110 includes memory blocks each comprising a number of cell strings ST0, ST1 . . . STm.

Each of the cell strings includes a number of memory cells coupled in series between a drain select transistor DST and a source select transistor SST. Word lines WL0 . . . WL31 are respectively coupled to the gates of the memory cells.

A drain selection line DSL is coupled to the gates of the drain select transistors DST, and a source selection line SSL is coupled to the gates of the source select transistors SST.

A bit line is coupled to the drain of the drain select transistor DST of each cell string. An even bit line BLe and an odd bit line BLo form a pair and each pair is coupled with one page buffer PB.

Furthermore, the source of the source select transistor SST of each cell string is coupled to a global source line SL.

The page buffer unit 120 includes a number of page buffers PB. Each page buffer PB is configured to latch data to be stored in a memory cell coupled to a selected bit line. The page buffers PB are also configured to store data read from a memory cell.

The X decoder 130 is configured to select the word lines, the drain selection line, and the source selection line when a program, verification, read, or erase operation is performed.

To perform the read operation or the verification operation, the nonvolatile memory device 100 first precharges a selected bit line through a corresponding page buffer PB.

Next, the nonvolatile memory device 100 supplies a selected word line with a read voltage or a verification voltage, and the remaining word lines with a pass voltage. Such an operation is called an evaluation process. According to the evaluation process, voltage of the selected bit line remains in a precharge state or it is discharged according to the state of data stored in a memory cell coupled to the selected word line.

Next, a changed voltage of the bit line is sensed, and a result of the sensing is latched in the page buffer PB.

During the evaluation process, the global source line SL is coupled to a ground node.

If the selected memory cell is in a program state, the voltage of the bit line remains in a precharge state. However, if the selected memory cell is not in a program state, the voltage of the bit line is discharged toward the global source line SL via a corresponding cell string.

The term 'program state' refers to a state in which the threshold voltage of a memory cell is higher than a read voltage or a verification voltage applied to the gate of the memory cell. The term 'erase state' refers to a state in which the threshold voltage of a memory cell is lower than a read voltage or a verification voltage applied to the gate of the memory cell.

Thus, in the program state, a memory cell is in a turn-off state, and in the erase state, a memory cell is in a turn-on state.

During the read operation or the verification operation, the voltage of a bit line may not be sufficiently discharged because of the resistance component of the global source line commonly coupled to the cell strings.

That is, the global source line must maintain a ground voltage level. However, the global source line has a bouncing resistor Rs. So, the global source line may not maintain 0 V, and instead, the voltage level may bounce because of an electric current flowing therethrough. If a bouncing phenomenon occurs in the global source line, the source line maintains a voltage more than 0 V during the evaluation process. Further, if the source line has a voltage more than 0 V, the voltage of a bit line may not be sufficiently discharged during the evaluation time when data of an erased cell are read.

BRIEF SUMMARY

Exemplary embodiments relate to a voltage generation circuit and a nonvolatile memory device including the same, which are capable of controlling a read voltage or a verification voltage by compensating for the bouncing phenomenon of a source line.

According to an aspect of this disclosure, there is provided a voltage generation circuit for providing a read or verification voltage of a nonvolatile memory device, including a first voltage generation unit configured to output a first voltage using a first reference voltage, a bouncing compensation unit configured to change the first voltage using a first control signal, the first voltage, and a voltage of a global source line when a read or verification operation is performed on the nonvolatile memory device and to output a changed first voltage as a second voltage, a second reference voltage generation unit configured to generate a second reference voltage, and an amplification unit configured to amplify a difference between the second voltage and the second reference voltage according to a set resistance ratio and to output a result of the amplification as a third voltage.

The first voltage generation unit includes a first reference voltage output unit configured to output the first reference voltage using a bandgap voltage, and a temperature compensation unit configured to change the first reference voltage according to temperature to obtain the first voltage, and output the first voltage.

The first voltage generation unit further includes a buffer configured to buffer and output the first voltage.

The second reference voltage is changed in order to change a voltage level of the third voltage.

The bouncing compensation unit includes a source line voltage supply unit configured to output the voltage of the global source line or some of the voltage of the global source line in response to the first control signal, and a second voltage output unit configured to generate the second voltage by reducing the first voltage according to the voltage outputted from the source line voltage supply unit.

The first control signal is used to determine a degree of bouncing compensation.

A nonvolatile memory device according to another aspect of this disclosure includes a memory cell array configured to include memory blocks including memory cells coupled to bit lines and word lines and configured to store data, page buffers each coupled to one or more of the bit lines and configured to store data to be programmed into a selected memory cell or to read data programmed into the selected memory cell and store the read data, a voltage supply unit configured to comprise a voltage generation circuit configured to, when data are read from one or more memory blocks selected from among the memory blocks or verification is performed on the selected memory blocks, change a level of a read voltage or a verification voltage in response to a voltage of a global source line to which the selected memory blocks are coupled and outputting a changed voltage, and a control unit configured to supply the voltage generation circuit with a control signal to control a degree in which the voltage generation circuit changes the level of the read voltage or the verification voltage in response to the voltage of the global source line.

The voltage generation circuit includes a first voltage output unit configured to output a first voltage using a first reference voltage, a bouncing compensation unit configured to change the first voltage using the control signal, the first voltage, and the voltage of the global source line, and to output the changed voltage as a second voltage, a second reference voltage generation unit configured to generate a second reference voltage, and an amplification unit configured to amplify a difference between the second voltage and the second reference voltage according to a set resistance ratio and to output a result of the amplification as the read voltage or the verification voltage.

The first voltage output unit includes a first reference voltage output unit configured to output the first reference voltage using a bandgap voltage, and a temperature compensation unit configured to change the first reference voltage according to temperature to obtain the first voltage, and output the first voltage.

The first voltage output unit further includes a buffer configured to buffer and output the first voltage.

The second reference voltage is changed in order to change the level of the read voltage or the verification voltage.

The bouncing compensation unit includes a source line voltage supply unit configured to output the voltage of the global source line or some of the voltage of the global source line in response to the control signal, and a second voltage output unit configured to generate the second voltage by reducing the first voltage according to the voltage outputted from the source line voltage supply unit.

The control signal is used to determine a degree of bouncing compensation.

A voltage generation circuit according to yet another aspect of this disclosure includes a first voltage generation unit configured to generate a first voltage, a bouncing compensation unit configured to control the first voltage in response to a control signal and a voltage of a global source line of a nonvolatile memory device, and an amplification unit configured to amplify a difference between a reference voltage and an output voltage of the bouncing compensation unit and to generate a second voltage for a verification or read operation of the nonvolatile memory device.

The first voltage generation unit includes a first reference voltage output unit configured to output the first reference voltage using a bandgap voltage, and a temperature compensation unit configured to change the first reference voltage according to temperature to obtain the first voltage, and output the first voltage.

The first voltage generation unit further includes a buffer configured to buffer and output the first voltage.

The reference voltage is changed in order to change a voltage level of the second voltage.

The bouncing compensation unit includes a source line voltage supply unit configured to output the voltage of the global source line or some of the voltage of the global source line in response to the control signal, and a first voltage control unit configured to control a level of the first voltage such that the voltage level of the first voltage is lowered according to the voltage outputted from the source line voltage supply unit.

The control signal is used to determine a degree of bouncing compensation.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 2:
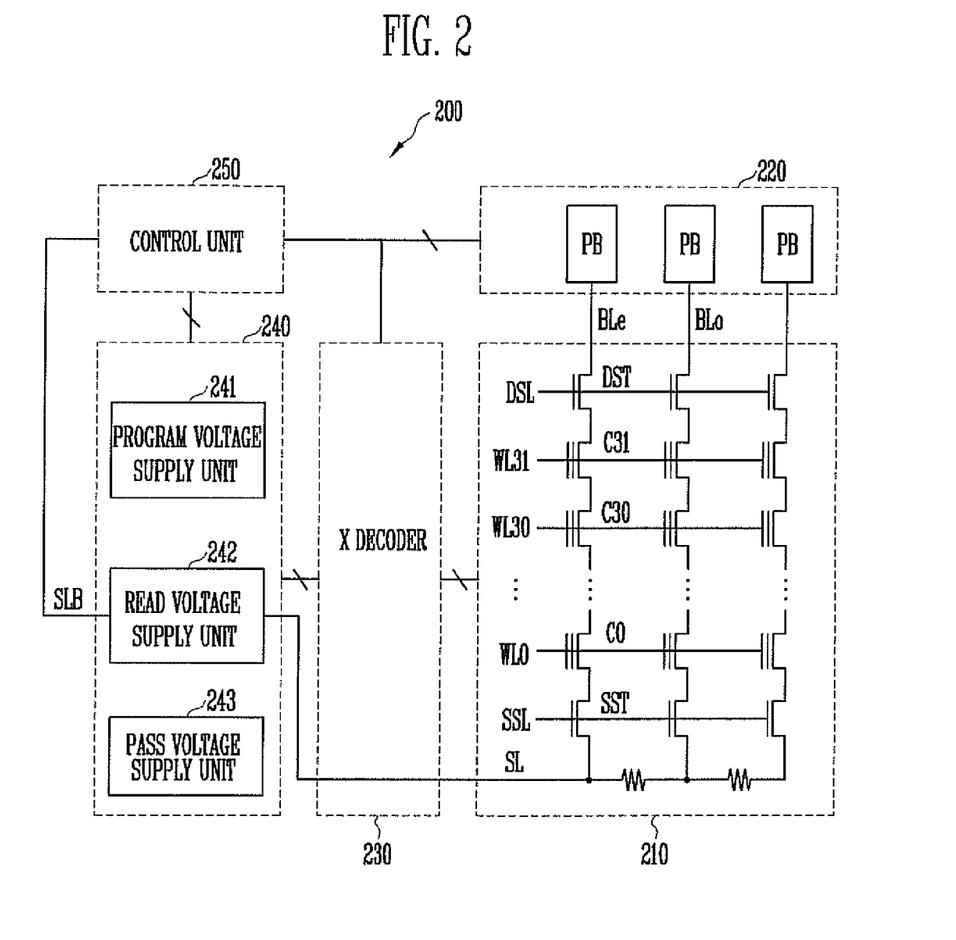
FIG. 2 is a diagram showing a nonvolatile memory device according to an embodiment of this disclosure.

FIG. 2 shows a nonvolatile memory device according to an exemplary embodiment of this disclosure.

Referring to FIG. 2, the nonvolatile memory device 200 includes a memory cell array 210, a page buffer unit 220, an X decoder 230, a voltage supply unit 240, and a control unit 250.

The memory cell array 210 includes memory blocks comprising a number of memory cells. Only one memory block is illustrated in FIG. 2 for simplicity.

The memory block includes a number of cell strings. Each of the cell strings includes a drain select transistor DST, a source select transistor SST, and first to thirty-second memory cells C0 to C31.

The gates of the drain select transistors DST of the cell strings are commonly coupled to a drain selection line DSL. The gates of the source select transistors SST of the cell strings are commonly coupled to a source selection line SSL. Furthermore, the gates of the first to thirty-second memory cells C0 to C31 are respectively coupled to first to thirty-second word lines WL0 to WL31.

A bit line BLe or BLo is coupled to the drain of the drain select transistor DST of each of the cell strings. Furthermore, the sources of the source select transistors SST of the cell strings are commonly coupled to a global source line SL.

The page buffer 220 includes page buffers PB. Each of the page buffers is coupled to one or more bit lines. The page buffer is configured to temporarily store data to be programmed into a memory cell coupled to a selected bit line or to read data programmed into a selected memory cell.

The X decoder 230 is configured to select one of the memory blocks and to enable the selected memory block in response to a control signal.

The voltage supply unit 240 is configured to generate operation voltages for program, read, and erase operations. The voltage supply unit 240 includes a program voltage supply unit 241 configured to supply the program voltage and a read voltage supply unit 242 configured to supply the read voltage. The voltage supply unit 240 further includes a pass voltage supply unit 243 configured to supply a pass voltage. Here, the read voltage supply unit 242 can also supply a verification voltage, as well as, the read voltage.

In the nonvolatile memory device 200, the verification operation and the read operation are performed in the same manner. Accordingly, only the read operation is described for simplicity. The read operation described below can be similarly applied to the verification operation.

The level of the read voltage outputted from the read voltage supply unit 242 can be controlled in response to the voltage of the global source line of an enabled memory block, in which a bouncing phenomenon may occur.

The control unit 250 is configured to generate bouncing control signals SLB<0:1> to compensate for a bouncing phenomenon of the global source line, and to output control signals for controlling the program, read, and erase operations of the nonvolatile memory device 200.

The bouncing control signals SLB<0:1> are used to determine how much to compensate the supplied voltages in light of the bouncing. In one or more embodiments of this disclosure, the degree of compensation is determined according to two states of the bouncing control signals SLB<01> and SLB<00>. However, the present disclosure is not limited thereto, and various degrees of compensation are possible by increasing the number of states of the bouncing compensation signals SLB<0:1>.

Information about the bouncing compensation signals SLB<0:1> is stored based on option information (i.e., information for the different operations controlled by the control unit 250). Furthermore, the bouncing compensation signals SLB<0:1> may be changed according to option information inputted by a user from outside the nonvolatile memory device 200. Alternatively, the bouncing compensation signals SLB<0:1> may be automatically changed through an algorithm that changes the degree of compensation according to the erase/write (E/W) cycle.

The voltage level of a read voltage generated by the read voltage supply unit 242 is controlled in response to the bouncing control signals SLB<0:1> and the voltage of the global source line SL.

Figure 3A:
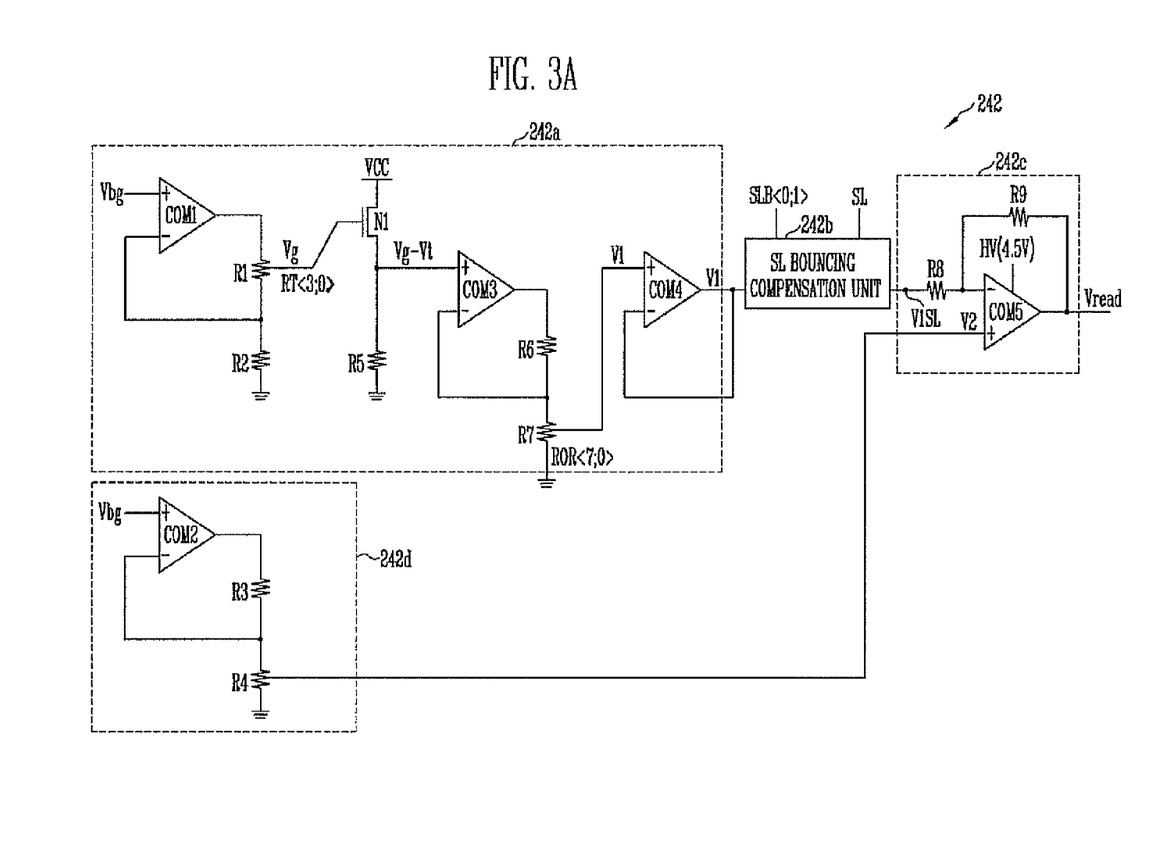
FIG. 3A is a circuit diagram of a read voltage supply unit shown in FIG. 2.

FIG. 3A is a circuit diagram of the read voltage supply unit 242 shown in FIG. 2.

Referring to FIG. 3A, the read voltage supply unit 242 includes a first reference voltage control unit 242a, a source line (SL) bouncing compensation unit 242b, an amplification unit 242c, and a second reference voltage generation unit 242d.

The first reference voltage control unit 242a comprises a first reference voltage output unit which is configured to generate a first reference voltage Vg, a temperature compensation unit which is configured to convert the first reference voltage Vg according to temperature, and a buffer which is configured to output a result of the conversion as a first voltage V1.

The SL bouncing compensation unit 242b is configured to modify the first voltage V1 to compensate for a bouncing phenomenon according to a bouncing voltage, generated by the global source line, using the bouncing control signals SLB<0:1> and voltage of the global source line, and to output a result of the compensation as a bouncing compensation voltage V1SL.

The amplification unit 242c is configured to amplify a difference between the bouncing compensation voltage V1SL and a second reference voltage V2, and output an amplified voltage. The output of the amplification unit 242c is a read voltage Vread.

The second reference voltage generation unit 242d is configured to generate the second reference voltage V2.

The first reference voltage control unit 242a includes a first comparator COM1, third and fourth comparators COM3, COM4, first and second resistors R1, R2, fifth to seventh resistors R5, R6, and R7, and a first NMOS transistor N1. The first reference voltage output unit includes the first comparator COM1 and the first and second resistors R1, R2. The temperature compensation unit includes the first NMOS transistor N1, the third comparator COM3 and the fifth to seventh resistors R5, R6, R7. And the buffer includes the fourth comparator COM4.

The amplification unit 242c includes eighth and ninth resistors R8, R9 and a fifth comparator COM5. The second reference voltage generation unit 242d includes third and fourth resistors R3, R4 and a second comparator COM2.

The circuit of the SL bouncing compensation unit 242b is described in detail later.

The first and second resistors R1, R2 are coupled in series between a ground node and the output terminal of the first comparator COM1. The first resistor R1 is a variable resistor whose resistance is changed in response to first trimming signals RT<3:0>.

A feedback voltage outputted from a common node of the first and second resistors R1, R2 is inputted to the inverting terminal (−) of the first comparator COM1. A bandgap voltage Vbg is inputted to the non-inverting terminal (+) of the first comparator COM1.

The first reference voltage Vg, applied to the first resistor R1 according to a shift in the resistance of the first resistor R1, is inputted to the gate of the first NMOS transistor N1.

The first NMOS transistor N1 and the fifth resistor R5 are coupled in series between a power source voltage VCC and the ground node. A voltage (Vg−Vt) outputted from a common node of the first NMOS transistor N1 and the fifth resistor R5 is inputted to the non-inverting terminal (+) of the third comparator COM3.

The sixth and seventh resistors R6, R7 are coupled in series between the ground node and the output of the third comparator COM3. A feedback voltage outputted from a common node of the sixth and seventh resistors R6, R7 is inputted to the inverting terminal (−) of the third comparator COM3.

The resistance value of the seventh resistor R7 is changed in response to second trimming signals ROR<7:0>. Voltage applied to the seventh resistor R7 according to a shift in the resistance value of the seventh resistor R7 is the first voltage V1.

The first voltage V1 is inputted to the non-inverting terminal (+) of the fourth comparator COM4. Furthermore, the output terminal of the fourth comparator COM4 is coupled to the inverting terminal (−) thereof. Thus, the fourth comparator COM4 is configured to function as a buffer. Therefore the fourth comparator COM4 is configured to output the first voltage V1 which is inputted into the non-inverting terminal (+) thereof.

The first voltage V1 is inputted to the SL bouncing compensation unit 242b. The SL bouncing compensation unit 242b is configured to output the bouncing compensation voltage V1SL according to a voltage of the global source line.

The eighth resistor R8 is coupled between the output terminal of the SL bouncing compensation unit 242b and the inverting terminal (−) of the fifth comparator COM5. The fifth comparator COM5 is operated with an operation voltage HV(4.5V). The ninth resistor R9 is coupled between the inverting terminal (−) and the output terminal of the fifth comparator COM5. The output of the fifth comparator COM5 is the read voltage Vread.

The second reference voltage V2 is inputted to the non-inverting terminal (+) of the fifth comparator COM5.

The third and fourth resistors R3, R4 are coupled in series between the ground node and the output terminal of the second comparator COM2. A feedback voltage outputted from a common node of the third and fourth resistors R3, R4 is inputted to the inverting terminal (−) of the second comparator COM2. Meanwhile, a bandgap voltage Vbg is inputted to the non-inverting terminal (+) of the second comparator COM2.

The resistance value of each of the third and fourth resistors R3, R4 is changed in response to trimming signals. To determine a read voltage Vread to be outputted, the resistance values of the third and fourth resistors R3, R4 are changed. The voltage applied to the fourth resistor R4 is the second reference voltage V2.

In the above circuit, the first comparator COM1 and the first and second resistors R1, R2 constitute a reference voltage generation circuit for generating the first reference voltage Vg.

When the bandgap voltage Vbg is received, the first comparator COM1 outputs a signal of a high level. The output of the first comparator COM1 is divided according to the resistance values of the first and second resistors R1, R2 and then inputted to the first comparator COM1 as a feedback voltage. The output signal of the first comparator COM1 is changed in response to the feedback voltage. Accordingly, the first reference voltage Vg having a regular voltage level is outputted. The voltage applied to the first resistor R1 is the first reference voltage Vg.

Furthermore, the first NMOS transistor N1 and the fifth resistor R5 constitute a temperature compensation circuit. Using a characteristic of the first NMOS transistor N1 in which its resistance value changes according to temperature, the first NMOS transistor N1 outputs the first reference voltage Vg as the voltage Vg−Vt.

The voltage Vg−Vt which is inputted in the third comparator COM3 is changed into the first voltage V1 according to resistance ratio of the six and seven resistors R6, R7.

The fourth comparator COM4 is configured to output the first voltage V1 which is inputted into the non-inverting terminal (+) thereof.

The level of the read voltage Vread is determined based on the first voltage V1 and the second reference voltage V2. To change the level of the read voltage Vread, the resistance values of the third and fourth resistors R3, R4 are changed such that the second reference voltage V2 is changed.

That is, when the second reference voltage V2 is shifted in response to the first voltage V1, the level of the read voltage Vread is also changed. In exemplary embodiments of this disclosure, bouncing compensation for the read voltage Vread is performed by modifying the first voltage V1 in response to the degree of bouncing.

The amplification unit 242c is configured to amplify a difference between the bouncing compensation voltage V1SL and the second reference voltage V2 according to the resistance ratio of the eighth and ninth resistors R8, R9 and to output a result of the amplification as the read voltage Vread.

$$Vread = V2 + \frac{R9}{R8}[V2 - V1SL] \quad \text{(Equation 1)}$$

As shown in Equation 1, the amplification unit 242c amplifies the read voltage Vread using the second reference voltage V2, the bouncing compensation voltage V1SL, and the resistance ratio of the eighth and ninth resistors R8, R9.

The SL bouncing compensation unit 242b according to the embodiment of this disclosure is described in detail below.

Figure 3B:
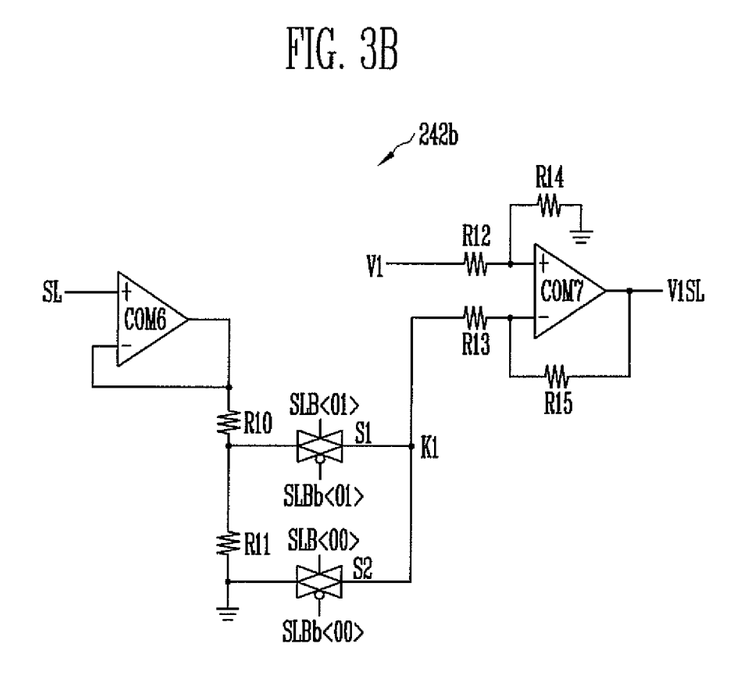
FIG. 3B is a circuit diagram showing a source line bouncing compensation unit of FIG. 3A.

FIG. 3B shows the SL bouncing compensation unit of FIG. 3A.

Referring to FIG. 3B, the SL bouncing compensation unit 242b includes sixth and seventh comparators COM6, COM7, tenth to fifteenth resistors R10 to R15, and first and second switches S1, S2.

The voltage of the global source line SL is inputted to the non-inverting terminal (+) of the sixth comparator COM6. The output terminal and the inverting terminal (−) of the sixth comparator COM6 are coupled together. Accordingly, the sixth comparator COM6 functions as a buffer configured to output the voltage of the global source line SL.

The tenth and eleventh resistors R10, R11 are coupled in series between the ground node and the output of the sixth comparator COM6. The first switch S1 is coupled between a node K1 and a common node of the tenth and eleventh resistors R10, R11. The second switch S2 is coupled between the node K1 and a node between the eleventh resistor R11 and the ground node.

The first switch S1 is turned on in response to the first bouncing control signal SLB<01>, and the second switch S2 is turned on in response to the second bouncing control signal SLB<00>. An inverted first bouncing control signal SBLb<01> is an invert signal of the first bouncing control signal SLB<01> and an inverted second bouncing control signal SBLb<00> is an invert signal of the second bouncing control signal SLB<00>.

The first bouncing control signal SLB<01> is outputted in order to control bouncing compensation according to the resistance ratio of the tenth and eleventh resistors R10, R11. The second bouncing control signal SLB<00> is outputted when bouncing compensation is not performed.

Voltage at the node K1 when the first bouncing control signal SLB<01> is outputted can be expressed by the following equation.

$$Vk1 = \frac{R11}{(R10 + R11)} \times SL \quad \text{(Equation 2)}$$

The twelfth resistor R12 is coupled between the input terminal of the first voltage V1 and the non-inverting terminal (+) of the seventh comparator COM7. The thirteenth resistor R13 is coupled between the node K1 and the inverting terminal (−) of the seventh comparator COM7.

The fourteenth resistor R14 is coupled between the ground node and the non-inverting terminal (+) of the seventh comparator COM7. The fifteenth resistor R15 is coupled between the inverting terminal (−) and the output terminal of the seventh comparator COM7. The output of the seventh comparator COM7 is the bouncing compensation voltage V1SL.

In the SL bouncing compensation unit 242b, the twelfth to fifteenth resistors R12 to R15 are set to have the same resistance value. Accordingly, the seventh comparator COM7 outputs a value in which the first voltage is reduced by a percentage of the voltage at the node K1 depending on the resistance ratio.

In the case in which the first bouncing control signal SLB<01> is inputted, the bouncing compensation voltage V1SL can be expressed by the following equation.

$$V1SL = V1 - \left[\frac{R11}{(R10+R11)} \times SL\right] \quad \text{(Equation 3)}$$

If the second bouncing control signal SLB<00> is received, the bouncing compensation voltage V1SL becomes equal to the first voltage V1 without bouncing compensation. That is, bouncing compensation is never performed.

In the case in which the degree of bouncing compensation is controlled in various ways, a switch can be coupled between the node K1 and the output terminal of the sixth comparator COM6, and the bouncing control signal can be inputted to the switch. In this case, a bouncing phenomenon can be fully (i.e., 100%) compensated for. Alternatively, the degree of compensation can be controlled by further diversifying the tenth and eleventh resistors R10, R11 and coupling a node between the resistors to the node K1.

When data of the nonvolatile memory device 200 according to the embodiment of this disclosure are read, the SL bouncing compensation unit 242b compensates for the bouncing phenomenon of the global source line and outputs the bouncing compensation voltage V1SL. Thus, the amplification unit 242c outputs the read voltage Vread whose bouncing has been compensated for.

The amount of the read voltage Vread whose bouncing is compensated for in response to the first bouncing control signal SLB<01> and then outputted can be expressed using the following equation.

$$\begin{aligned}Vread &= V2 - \frac{R9}{R8}[V2 - V1SL] \\ &= V2 + \frac{R9}{R8}\left[V2 - V1 + \frac{R11}{(R10+R11)} \times SL\right]\end{aligned} \quad \text{(Equation 4)}$$

As shown in Equation 4, when bouncing is generated in the global source line SL, the read voltage Vread rises. Accordingly, in the case in which discharge is not properly performed because of such bouncing, the read voltage is raised so that the degree that a memory cell is turned-on is increased and discharge is fully performed.

An operation of reading data using the read voltage Vread whose bouncing has been compensated for is described below.

In the case in which data are read in the nonvolatile memory device 200 according to the embodiment of this disclosure, a selected bit line is first precharged.

A read voltage Vread is applied to a selected word line, and a pass voltage Vpass is applied to unselected word lines. Here, the read voltage Vread that is first inputted corresponds to a read voltage Vread that is set by default before compensating for bouncing occurring in the global source line.

If such bouncing is not generated in the global source line, the global source line remains at 0 V. Furthermore, if a selected memory cell is a program cell, it remains turned off because the read voltage Vread is applied to the gate of the memory cell. If the selected memory cell is an erased cell, it is turned on because the read voltage Vread is applied to the gate of the memory cell. The program cell refers to a memory cell that has a threshold voltage more than the read voltage Vread applied to the gate. The erased cell refers to a memory cell that has a threshold voltage less than the read voltage Vread applied to the gate.

In the case in which the memory cell is a program cell, voltage of the bit line is not changed because the memory cell is turned off. Accordingly, data are normally read irrespective of bouncing in the global source line.

However, in the case in which the memory cell is an erased cell, the voltage of the bit line must be discharged through the global source line because the memory cell is turned on. At this time, if bouncing is generated in the global source line, the voltage of the bit line is not discharged during a set time.

Accordingly, the SL bouncing compensation unit 242b outputs the bouncing compensation voltage V1SL, comparable to a bouncing voltage generated in the global source line, in order to raise the read voltage Vread according to the degree of the bouncing. As described above, the read voltage Vread is first inputted by default, and after a lapse of some time, the level of the read voltage Vread is changed to a voltage level in which bouncing has been compensated for. Accordingly, the memory cell is turned on at a higher voltage and, so the bit line is undergoes a normal precharge. Consequently, a normal read operation can be performed to read data.

The degree of bouncing compensation, as described above, can be variably controlled in response to the bouncing control signals SLB<0:1>.

As described above, the voltage generation circuit and the nonvolatile memory device, including the same, according to the embodiments of this disclosure control a read or verification voltage by compensating for bouncing occurring in the global source line. Accordingly, malfunction resulting from source line bouncing can be prevented.

What is claimed is:

1. A voltage generation circuit for providing a read voltage of a nonvolatile memory device, comprising:
    a first voltage generation unit configured to output a first voltage using a first reference voltage;
    a bouncing compensation unit configured to change the first voltage using a first control signal, the first voltage, and a voltage of a global source line when a read operation is performed on the nonvolatile memory device, and to output a changed first voltage as a second voltage;
    a second reference voltage generation unit configured to generate a second reference voltage; and
    an amplification unit configured to amplify a difference between the second voltage and the second reference voltage according to a set resistance ratio and to output a result of the amplification as a read voltage for the read operation.

2. The voltage generation circuit of claim 1, wherein the first voltage generation unit comprises:
    a first reference voltage output unit configured to output the first reference voltage using a bandgap voltage; and
    a temperature compensation unit configured to change the first reference voltage according to temperature to obtain the first voltage, and output the first voltage.

3. The voltage generation circuit of claim 2, wherein the first voltage generation unit further comprises a buffer configured to buffer the first voltage and output the first voltage.

4. The voltage generation circuit of claim 1, wherein the second reference voltage is changed in order to change a voltage level of the read voltage.

5. The voltage generation circuit of claim 2, wherein the bouncing compensation unit comprises:
a source line voltage supply unit configured to output the voltage of the global source line or some of the voltage of the global source line in response to the first control signal; and
a voltage output unit configured to generate the second voltage by reducing the first voltage according to the global source line or some of the voltage of the global source line from the source line voltage supply unit.

6. The voltage generation circuit of claim 5, wherein the first control signal is used to determine a degree of bouncing compensation.

7. A nonvolatile memory device, comprising:
a memory cell array configured to comprise memory blocks comprising memory cells coupled to bit lines and word lines and configured to store data;
page buffers each coupled to one or more of the bit lines and configured to store data to be programmed into a selected memory cell or to read data programmed into the selected memory cell and store the read data; and
a voltage generation circuit configured to, when data are read from one or more memory blocks selected from among the memory blocks, change a level of a read voltage in response to a voltage of a global source line to which the selected memory blocks are coupled and output the read voltage having a changed level,
wherein the voltage generation circuit comprises:
a first voltage output unit configured to output a first voltage using a first reference voltage;
a bouncing compensation unit configured to change the first voltage using a control signal, the first voltage, and the voltage of the global source line, and to output the changed first voltage as a second voltage;
a second reference voltage generation unit configured to generate a second reference voltage; and
an amplification unit configured to amplify a difference between the second voltage and the second reference voltage according to a set resistance ratio, and to output a result of the amplification as the read voltage.

8. The nonvolatile memory device of claim 7, further comprising a control unit configured to supply the control signal to the voltage generation circuit to control a degree in which the read voltage changes.

9. The nonvolatile memory device of claim 8, wherein the first voltage output unit comprises:
a first reference voltage output unit configured to output the first reference voltage using a bandgap voltage; and
a temperature compensation unit configured to change the first reference voltage according to temperature to obtain the first voltage, and output the first voltage.

10. The nonvolatile memory device of claim 9, wherein the first voltage output unit further comprises a buffer configured to buffer and output the first voltage.

11. The nonvolatile memory device of claim 7, wherein the second reference voltage is changed in order to change the level of the read voltage.

12. The nonvolatile memory device of claim 9, wherein the bouncing compensation unit comprises:
a source line voltage supply unit configured to output the voltage of the global source line or some of the voltage of the global source line in response to the control signal; and
a voltage output unit configured to generate the second voltage by reducing the first voltage according to the global source line or some of the voltage of the global source line from the source line voltage supply unit.

13. The nonvolatile memory device of claim 12, wherein the control signal is used to determine a degree of bouncing compensation.

14. A voltage generation circuit, comprising:
a first voltage generation unit configured to generate a first voltage;
a bouncing compensation unit configured to control the first voltage in response to a control signal and a voltage of a global source line when a read operation is performed on a nonvolatile memory device;
an amplification unit configured to amplify a difference between a reference voltage and an output voltage of the bouncing compensation unit according to a set resistance ratio and to generate a second voltage for a read operation of the nonvolatile memory device; and
a control unit configured to generate the control signal to control a degree in which the first voltage changes,
wherein the first voltage generation unit comprises:
a first reference voltage output unit configured to output a first reference voltage using a bandgap voltage; and
a temperature compensation unit configured to change the first reference voltage according to temperature to obtain the first voltage, and output the first voltage.

15. The voltage generation circuit of claim 14, wherein the first voltage generation unit further comprises a buffer configured to buffer and output the first voltage.

16. The voltage generation circuit of claim 14, wherein the reference voltage is changed in order to change a voltage level of the second voltage.

17. The voltage generation circuit of claim 14, wherein the bouncing compensation unit comprises:
a source line voltage supply unit configured to output the voltage of the global source line or some of the voltage of the global source line in response to the control signal; and
a first voltage control unit configured to control a level of the first voltage such that the voltage level of the first voltage is lowered according to the global source line or some of the voltage of the global source line from the source line voltage supply unit.

18. The voltage generation circuit of claim 17, wherein the control signal is used to determine a degree of bouncing compensation.

* * * * *